(12) United States Patent
Cherala et al.

(10) Patent No.: US 11,262,652 B2
(45) Date of Patent: Mar. 1, 2022

(54) NANOFABRICATION METHOD WITH CORRECTION OF DISTORTION WITHIN AN IMPRINT SYSTEM

(71) Applicant: CANON KABUSHIKI KAISHA, Tokyo (JP)

(72) Inventors: Anshuman Cherala, Austin, TX (US); Ahmed M. Hussein, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/912,153

(22) Filed: Jun. 25, 2020

(65) Prior Publication Data

US 2021/0405524 A1    Dec. 30, 2021

(51) Int. Cl.
*B05D 1/02* (2006.01)
*G03F 7/00* (2006.01)

(52) U.S. Cl.
CPC .................................. *G03F 7/0002* (2013.01)

(58) Field of Classification Search
None
See application file for complete search history.

(56) References Cited

U.S. PATENT DOCUMENTS

| 6,936,194 | B2 | 8/2005 | Watts |
| 7,157,036 | B2 | 1/2007 | Choi et al. |
| 8,066,930 | B2 | 11/2011 | Sreenivasan et al. |
| 8,076,386 | B2 | 12/2011 | Xu et al. |
| 8,349,241 | B2 | 1/2013 | Sreenivasan et al. |
| 9,993,962 | B2 | 6/2018 | Cherala |
| 2017/0334126 | A1* | 11/2017 | Cherala ............... B29C 35/0805 |

* cited by examiner

*Primary Examiner* — Alexander M Weddle
(74) *Attorney, Agent, or Firm* — Canon U.S.A., Inc., IP Division

(57) ABSTRACT

A nanofabrication method comprises receiving information regarding a distortion within an imprint system, generating a first drop pattern that is not based on the received information, generating a second drop pattern and a third drop pattern, each based on the received information, modifying the first drop pattern to generate a fourth drop pattern. The modifying includes adding a first plurality of drop positions to the first drop pattern or removing a second plurality of drop positions from the first drop pattern, thereby forming an intermediate drop pattern, and either removing the second plurality of drop positions from the intermediate drop pattern or adding the first plurality of drops to the intermediate pattern. The first plurality of drop positions corresponds to drop positions defined by the second drop pattern and the second plurality of drop positions corresponds to drop positions defined by the third drop pattern.

20 Claims, 9 Drawing Sheets

NANOFABRICATION METHOD WITH CORRECTION OF DISTORTION WITHIN AN IMPRINT SYSTEM

BACKGROUND

Field of Art

The present disclosure relates to a nanofabrication method, and in particular, a nanofabrication method that corrects for distortion within an imprint system without substantially increasing the mean residual layer thickness.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

U.S. Pat. No. 9,993,962 discloses a method for imprinting to correct for a distortion within an imprint system to improve overlay. The method disclosed in the '962 patent performs the correction using a modified drop pattern dispensed during an imprint process. However, using the modified drop pattern during the imprint process has a disadvantage because the modified drop pattern requires the application of additional formable material as compared to a non-modified drop pattern. The application of additional formable increases the mean residual layer thickness (RLT), which may negatively impact aspects of the imprint process and/or subsequent processes. That is, while the method disclosed in the '962 patent improves overlay, it is potentially at the expense of the imprint process and/or subsequent processes. Thus, there is a need in the art for a nanofabrication method that corrects for distortion within an imprint system to improve overlay, without increasing the mean RLT.

SUMMARY

A nanofabrication method comprises receiving information regarding a distortion within an imprint system, generating a first drop pattern of formable material that is not based on the received information regarding the distortion within the imprint system, generating a second drop pattern of formable material and a third drop pattern of formable material, each based on the received information regarding the distortion within the imprint system, modifying the first drop pattern to generate a fourth drop pattern of formable material, dispensing drops of formable material onto a substrate according to the fourth drop pattern, and contacting the dispensed drops with a template or superstrate to form a film. The modifying of the first drop pattern to generate the fourth drop pattern includes adding a first plurality of drop positions to the first drop pattern or removing a second plurality of drop positions from the first drop pattern, thereby forming an intermediate drop pattern, wherein the first plurality of drop positions corresponds to drop positions defined by the second drop pattern and the second plurality of drop positions corresponds to drop positions defined by the third drop pattern, in a case where the first plurality of drops positions are added to the first drop pattern to form the intermediate drop pattern, removing a second plurality of drop positions from the intermediate drop pattern, thereby forming the fourth drop pattern and in a case where the second plurality of drops positions are removed from the first drop pattern to form the intermediate drop pattern, adding the first plurality of drop positions to the intermediate drop pattern, thereby forming the fourth drop pattern.

A nanofabrication system comprises a first chuck configured to hold a template or superstrate, a second substrate chuck configured to hold a substrate, a processor configured to: receive information regarding a distortion within an imprint system, generate a first drop pattern of formable material that is not based on the received information regarding the distortion within the imprint system, generate a second drop pattern of formable material and a third drop pattern of formable material, each based on the received information regarding the distortion within the imprint system, modify the first drop pattern to generate a fourth drop pattern of formable material, wherein the modifying of the first drop pattern to generate the fourth drop pattern includes: adding a first plurality of drop positions to the first drop pattern or removing a second plurality of drop positions from the first drop pattern, thereby forming an intermediate drop pattern, wherein the first plurality of drop positions corresponds to drop positions defined by the second drop pattern and the second plurality of drop positions corresponds to drop positions defined by the third drop pattern, in a case where the first plurality of drops positions are added to the first drop pattern to form the intermediate drop pattern, removing the second plurality of drop positions from the intermediate drop pattern, thereby forming the fourth drop pattern, and in a case where the second plurality of drops positions are removed from the first drop pattern to form the intermediate drop pattern, adding the first plurality of drop positions to the intermediate drop pattern, thereby forming the fourth drop pattern, a fluid dispenser configured to dispense formable material on the substrate in accordance with the fourth drop pattern, a positioning system configured to contact the formable material with the template or superstrate in the template or superstrate chuck, and a curing system configured to cure the formable material under the template or superstrate so as to form cured formable material on the substrate.

A method of making an article comprises receiving information regarding a distortion within an imprint system, generating a first drop pattern of formable material that is not based on the received information regarding the distortion within the imprint system, generating a second drop pattern of formable material and a third drop pattern of formable material, each based on the received information regarding the distortion within the imprint system, modifying the first drop pattern to generate a fourth drop pattern of formable material, wherein the modifying of the first drop pattern to generate the fourth drop pattern includes: adding a first plurality of drop positions to the first drop pattern or removing a second plurality of drop positions from the first drop pattern, thereby forming an intermediate drop pattern, wherein the first plurality of drop positions corresponds to drop positions defined by the second drop pattern and the second plurality of drop positions corresponds to drop positions defined by the third drop pattern, in a case where the first plurality of drops positions are added to the first drop pattern to form the intermediate drop pattern, removing the second plurality of drop positions from the intermediate drop pattern, thereby forming the fourth drop pattern, in a case where the second plurality of drops positions are removed from the first drop pattern to form the intermediate drop pattern, adding the first plurality of drop positions to the intermediate drop pattern, thereby forming the fourth drop pattern, dispensing drops of formable material according to the fourth drop pattern onto the substrate, and contacting a template or a superstrate with the dispensed drops, thereby forming a pattern or a layer of the dispensed drops on the substrate, and processing the formed pattern or layer to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1:
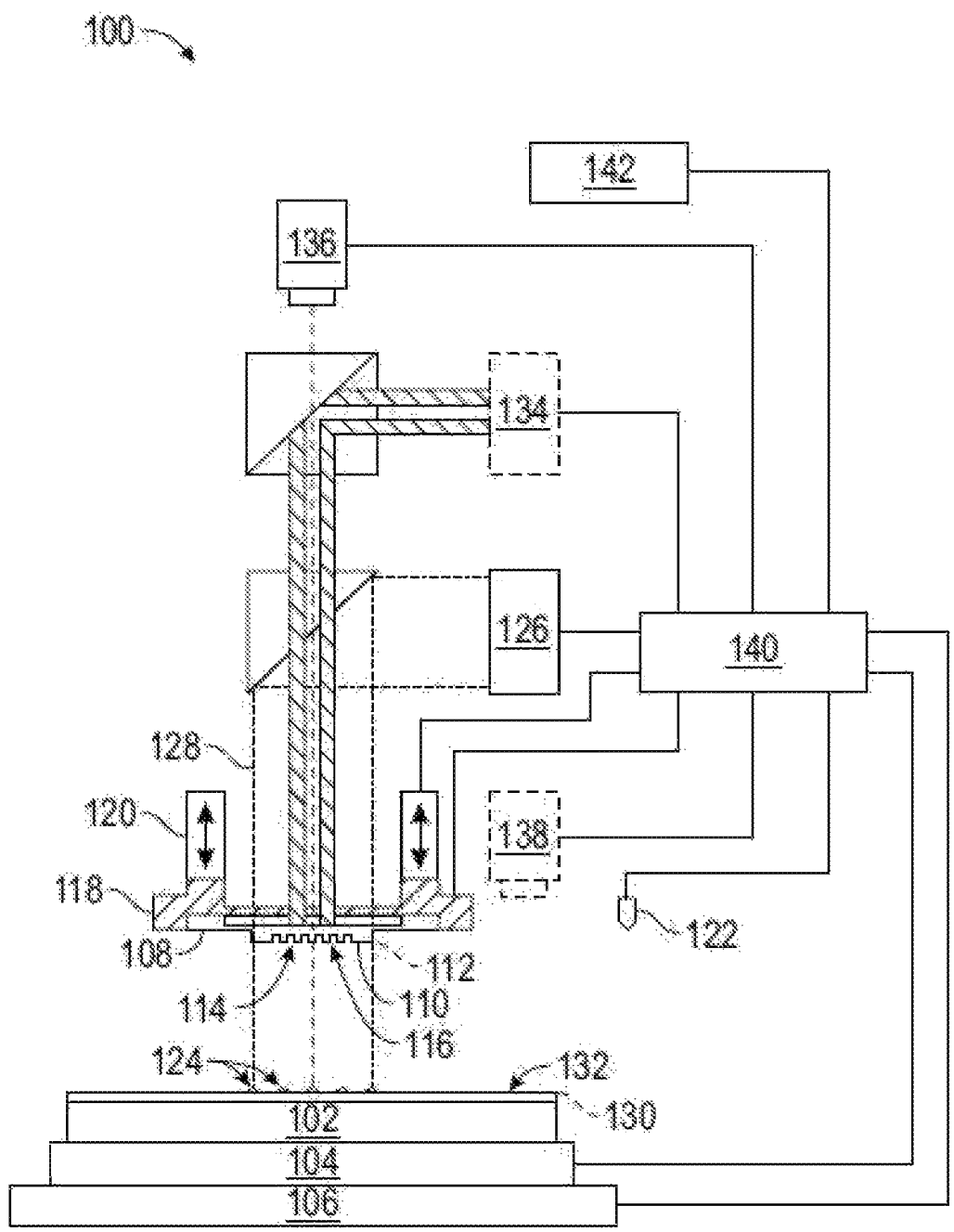
FIG. 1 is an illustration of an exemplary nanoimprint lithography system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

As noted above, a known drop pattern correction method (described in the '962 patent) corrects distortion within an imprint system to improve overlay at the expense of the imprint process and/or subsequent processes. Thus, it desirable for a nanofabrication method that corrects for distortion within an imprint system to improve overlay, without increase the mean RLT.

Nanofabrication System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

The template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, y, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 124. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 124. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
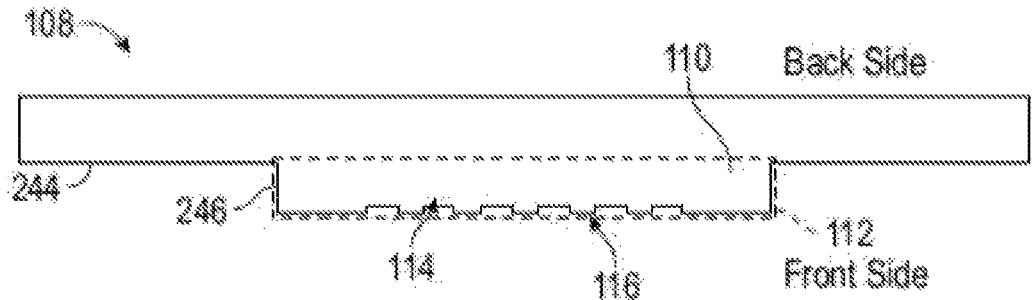
FIG. 2 is an illustration of an exemplary template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative template may be used in another embodiment, referred herein as a superstrate. In the case of the superstrate, the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
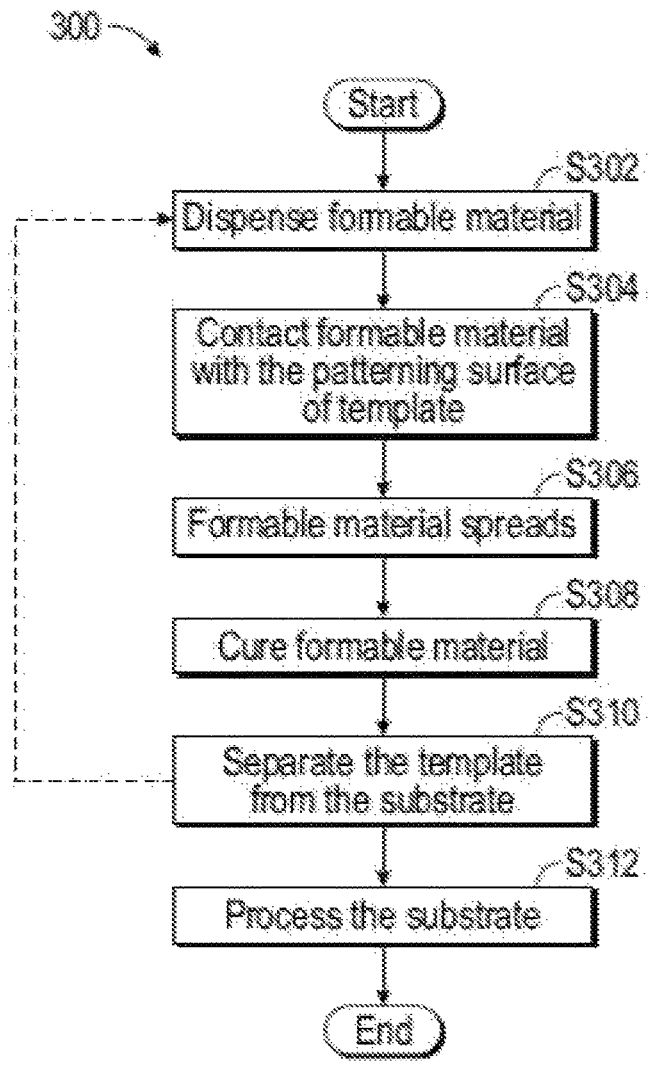
FIG. 3 is a flowchart illustrating an exemplary imprinting method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in Z^+\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

As noted above, the imprint system 100 may have distortion within the system that will negatively impact overlay unless accounted for. Overlay is the registration or alignment of one pattern layer to a second pattern layer and is important for the final article of manufacture (e.g., electronic device) to function correctly. For example, flatness or planarity deviations in the chuck can cause in-plane distortions in the substrate as the substrate conforms to the chuck. Even if the chuck is ideally flat, planarity deviations can exist in the wafer itself that similarly lead to in-plane distortions once the substrate is chucked. Further distortions can be introduced when an imprint template conforms to a non-flat substrate, likewise causing in-plane distortions in the template. These distortions all affect overlay accuracy. U.S. Pat. No. 9,993,962 (the '962 patent) discloses an imprint process that compensates for these distortions, and is incorporated by reference herein. The '962 patent discloses how to generate a particular drop pattern to be dispensed during the imprinting process. In one embodiment, the method disclosed therein includes determining a dispense pattern for the formable material based at least in part on the distortion, wherein the dispense pattern is performed such that the formable material is to be dispensed to a first areal density within a first area, where the distortion indicates that the at least one protrusion and a primary surface of the substrate will be further apart when the template contacts the formable material within the first area; and a second areal density within a second area, where the distortion indicates that the at least one protrusion and the primary surface of the substrate will be closer to each other when the template contacts the formable material within the second area, wherein the first areal density is greater than the second areal density.

As explained in the '962 patent, the method can include quantifying a distortion within the imprint system. Quantifying the distortion can include determining a deviation in planarity along a surface of a component within the imprint apparatus. The deviation in planarity may be measured as flatness along the primary surface of the chucking region, the primary surface of the substrate, along the primary surface of the mold, or any combination thereof. The flatness is measured along the primary surface of the substrate when it is over the chucking region of the substrate chuck. The flatness may be measured for the entire or nearly the entire substrate (for example, all imprint fields), a single imprint field, a selected combination of imprint fields (for example, the particular imprint field and immediately adjacent imprint fields), or the like. For regions that are lower in elevation, a higher areal density of formable material will be dispensed, and for regions that are higher in elevation, a lower areal density of formable material will be dispensed.

As explained in the '962 patent, another distortion can be a magnification or orthogonality distortion. A previously formed pattern in the substrate may be too small or too large as compared to the mold of the template. Such magnification distortions can be quantified by comparing the outer dimensions of the previously formed pattern in the substrate to the outer dimensions of the mold. If the previously formed pattern is too small relative to the mold of the template, a higher density of formable material can be dispensed near the center, as compared to the periphery, of the imprint field to cause the mold to have a concave surface, which reduces the size of the field to be printed within the formable material. If the previously formed pattern is too large relative to the mold of the template, a higher density of formable material can be dispensed near the periphery, as compared to the center, of the imprint field to cause the mold to have a convex surface, which increases the size of the field to be printed within the formable material. Similar approaches can be undertaken to correct for orthogonality distortions, such as skew and trapezoidal distortions.

As explained in the '962 patent, the method can further include determining a dispense pattern for the formable material. Information regarding the pattern of the mold, distortion within the system, and potentially other information is received by the processor from the memory, a metrology tool (for example, an interferometer, a profilometer, or the like), from an external source (for example, an integrated circuit layout file, a GDSII file, or an OASIS file is in an external memory, not illustrated), state information during exposure (temperature, humidity, energy source, areal energy density during exposure, or the like) or other suitable information that can affect patterning for the formable material.

Additional details for generating a drop pattern to account for imprint system distortion can be found in the '962 patent. While using a drop pattern that accounts for imprint system distortion is beneficial with respect to overlay, there are some disadvantages as well. A more significant disadvantage is that a drop pattern that accounts for imprint system deviation will result in a larger mean RLT as compared to a drop pattern that does not account for imprint system deviation. That is, a drop pattern that does not account for imprint system deviation can be particularly tailored to achieve target mean RLT. However, by changing the drop pattern to account for imprint system deviation, the number of drops being dispensed is increased such that the mean RLT will be increased. In other words, by using a drop pattern taking into account imprint system deviation, the overlay is improved, but mean RLT is increased. The nanofabrication method described herein includes the advantage of accounting for imprint system deviation, while avoiding these disadvantages.

Nanofabrication Method

Figure 4:
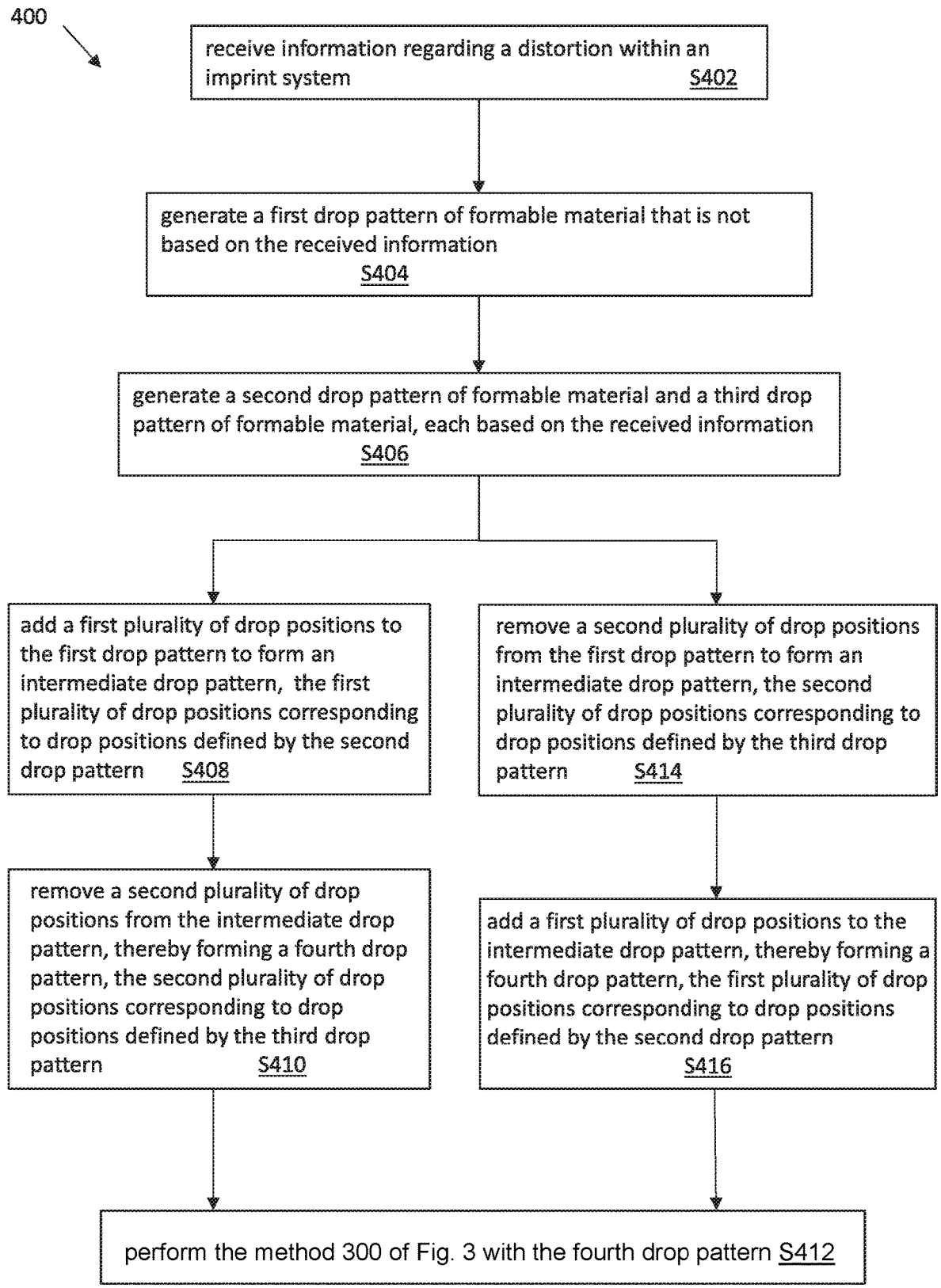
FIG. 4 is a flowchart illustrating an exemplary nanofabrication method in accordance with an example embodiment.

FIG. 4 is a flowchart illustrating an exemplary nanofabrication method 400 in accordance with an example embodiment. The nanofabrication method begins with step S402, where information regarding a distortion within the imprint system 100 is received. This step is performed in the same manner as the step of "quantifying a distortion within the imprint system" described in the '962 patent, which is incorporated by reference herein. That is, as noted above, following the method set forth in the '962 patent, the distortion with the imprinting system 100 can be quantified, the details of which are provided in the '962 patent. In particular, as set forth in the '962 patent, the information regarding the distortion within the imprint system may comprise a planar deviation of the substrate, a planar deviation of the template, a planar deviation of a surface of a chuck supporting the substrate, or any combination thereof. While not mentioned in the '962 patent, the information regarding the distortion within the imprint system may also include an image placement deviation of underlying features in an underlying layer of the substrate.

At step S404, a first drop pattern of formable material is generated. The first drop pattern can be generated using various methods known in the art. Notably, while the first drop pattern may be based on a variety of factors, none of the factors take into account deviation in the imprint system 100. That is, the first drop pattern is specifically generated without taking deviation in the imprint system 100 into account. In other words, the first drop pattern is generated based on factors that will result in an RLT that is closest to the target mean RLT and not based on factors that consider deviation in the imprint system 100.

As noted above, generating of the first drop pattern may take into account a pattern of the substrate and a pattern of the template, among the other aspects noted above. Generating the first drop pattern may include the processor 140 receiving a template pattern of the representative template 108 and also receiving a substrate pattern of the representative substrate 102. The template pattern may include information about the topography of the patterning surface 112 of the representative template 108. The topography of the patterning surface 112 may be measured and/or generated based on design data. The patterning surface 112 may be the same size as: an individual full field; multiple fields; the entire substrate, or larger than the substrate. As noted above, generating the first drop pattern may also take into account information regarding the substrate, including information about substrate topography. The substrate pattern may include information about substrate topography of the representative substrate, a field of the representative substrate and/or a full field of the representative substrate. The substrate topography may be measured, generated based on previous fabrication steps, and/or generated based on design data. The substrate topography may include information about the shape of an edge such as a beveled edge or a rounded edge of the representative substrate. The substrate topography may include information about a shape and position of a reference edge which surrounds the area of the substrate on which patterns are to be formed.

Once the template pattern and the substrate pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material, material properties of the patterning surface, material properties of the substrate, spatial variation in volume between the patterning surface and the substrate surface; fluid flow, evaporation; etc.

Figure 5A:
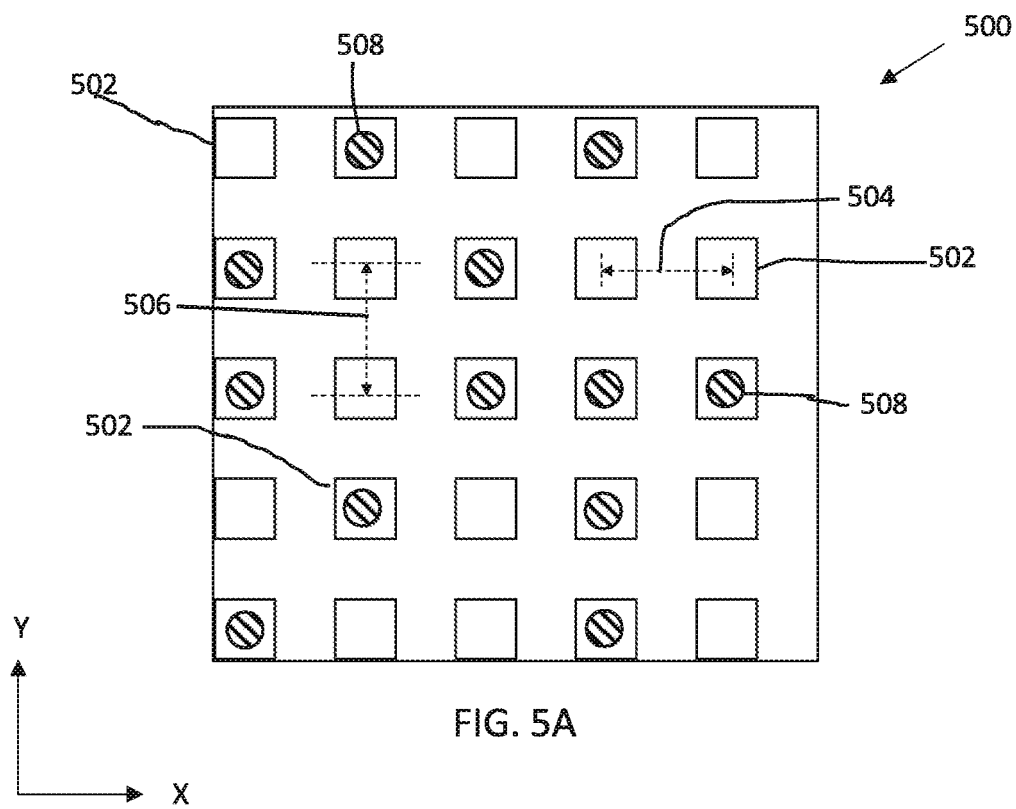
FIG. 5A is a schematic example of a first drop pattern generated in the exemplary nanofabrication method in accordance with an example embodiment.

FIG. 5A shows a schematic example of a first drop pattern 500 generated in step S404. As shown in FIG. 5A, the first drop pattern 500 comprises a set of potential drop positions 502 in a two-dimensional plane. Each of the potential drop positions 502 are designated by a box in FIG. 5A. The potential drop positions 502 appear in FIG. 5A as a series of rows and columns, where adjacent potential drop positions 502 are separated by a set distance, also known as the pitch. For a fluid droplet pattern, the pitch is a distance from the center of a potential droplet position to the center of the next adjacent potential droplet position. In other words, the pitch is a constant distance value representing the minimum distance between two adjacent drop positions within a drop pattern. In Cartesian coordinates, a two-dimensional droplet pattern (a pattern of droplets as seen from a top or plan view) can have a pitch in the X-dimension that corresponds to the distance between the centers of the features as measured in the X-dimension (X-dimension pitch 504), and a pitch in the Y-dimension that corresponds to the distance between the centers of the features as measured in the Y-dimension (Y-dimension pitch 506). In this case, the X and Y dimensions in the Cartesian coordinate system are perpendicular to each other.

The geometry of the dispenser 122, along with the ability of the system to move the stage, determines the size of the Y-dimension pitch 506 (i.e., the distance between two adjacent potential drop positions 502 along the Y-dimension in the drop pattern). That is, due to physical constraints, there is a fixed distance (i.e., pitch) between possible dispensing locations in the Y-dimension. With regard to the X-dimension pitch 504 (i.e., the distance between two adjacent potential drop positions 502 along the X-dimension in the drop pattern), the X-dimension pitch 504 is controlled by the timing of the dispensing of the droplets and the timing of the movement of the stage. That is, the X-dimension pitch 504 is not tied to the geometry of the dispenser as the Y-dimension pitch 506 is. In one example embodiment the timing of the movement of stage is coordinated with timing of the dispensing by the controller so that the X-dimension pitch 504 is equal in distance to the Y-dimension pitch 506. While the details of why the Y-dimension pitch and the X-dimension pitch are fixed is omitted herein for conciseness, the details can be found in U.S. application Ser. No. 16/670,497, the disclosure of which is expressly incorporated by reference herein. For the purposes of this description, it suffices to say that there is a fixed Y-dimension pitch 506 and a fixed X-dimension pitch 504 between potential drop positions 502 in the first drop pattern 500. Thus, the drop pattern 500 includes discrete potential drop positions 502. The same fixed pitches apply to all of the drop patterns discussed herein.

As shown in FIG. 5A, the drop pattern 500 includes a plurality of drop positions 508 that have been designated as positions for which a drop should be dispensed. The drop positions 508 for which a drop is designated to be dispensed is indicated by a circle in FIG. 5A. Each of the drop positions 508 are located within one of the squares representing the potential drop positions 502. The squares that do not have circles within them indicate that a drop is not designated to be dispensed from the particular location. Thus, the presence or absence of drops within the possible drop positions 502 defines the first drop pattern 500. While FIG. 5A shows only twelve designated drop positions among 25 possible drop locations for simplicity, an actual drop pattern may have thousands, tens of thousands, hundreds of thousands, or millions of designated drop positions/possible drop positions depending on the application. Furthermore, while the drop positions 502 are schematically shown as circles in FIG. 5A, it should be understood that in practice the drops are not necessarily circular and may have an amorphous shape. The first drop pattern 500 essentially represents the desired location of the drops 502 on the substrate 102 to produce a target RLT.

Figure 5B:
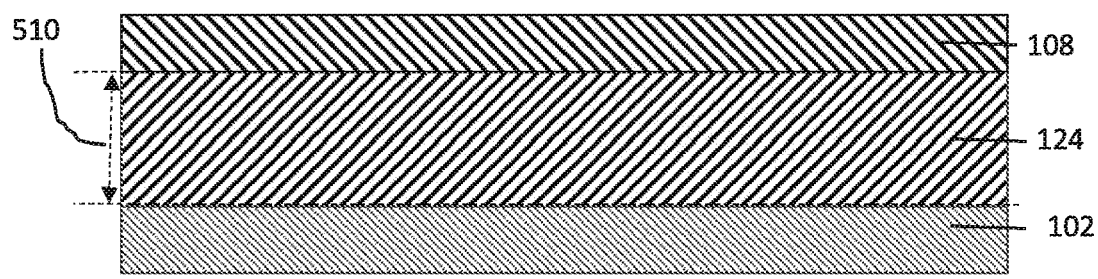
FIG. 5B shows a schematic sectional view of a case where formable material is dispensed onto the substrate according to the first drop pattern of FIG. 5A in accordance with an example embodiment.

FIG. 5B shows a schematic sectional view of a case where formable material 124 is dispensed onto the substrate 102 according to the first drop pattern 500 and contacted with the template 108, without performing the additional steps of the method 400 described herein. While formable material 124 is not in fact dispensed according to the first drop pattern 500 in the method described herein, FIG. 5B nevertheless assists in demonstrating a feature of the method described herein, which is discussed below in more detail. FIG. 5B shows the moment in time after the template 108 has contacted the formable material 124 dispensed according to the first drop pattern 500. As seen in FIG. 5B, after the template 108 has contacted the formable material 124, the formable material has resulted in a target mean RLT 510. The target mean RLT 510, as noted above, does not take into account distortion in the imprint system 100.

Figure 6A:
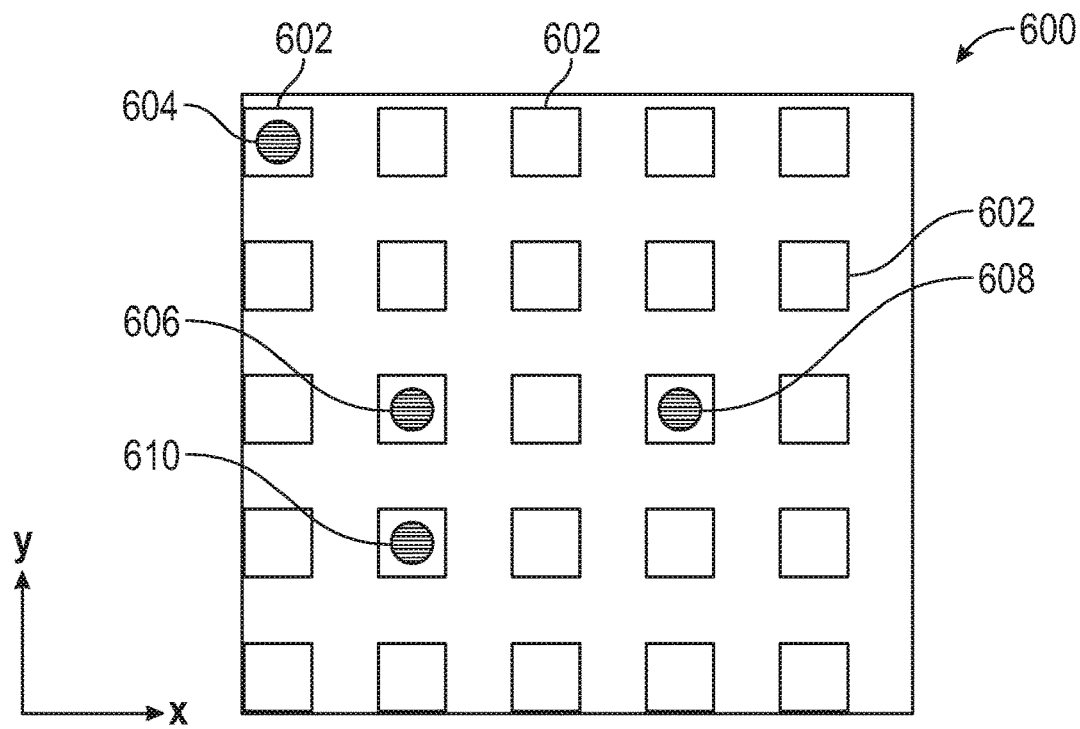
FIG. 6A is a schematic example of a second drop pattern generated in the exemplary nanofabrication method in accordance with an example embodiment.
Figure 6B:
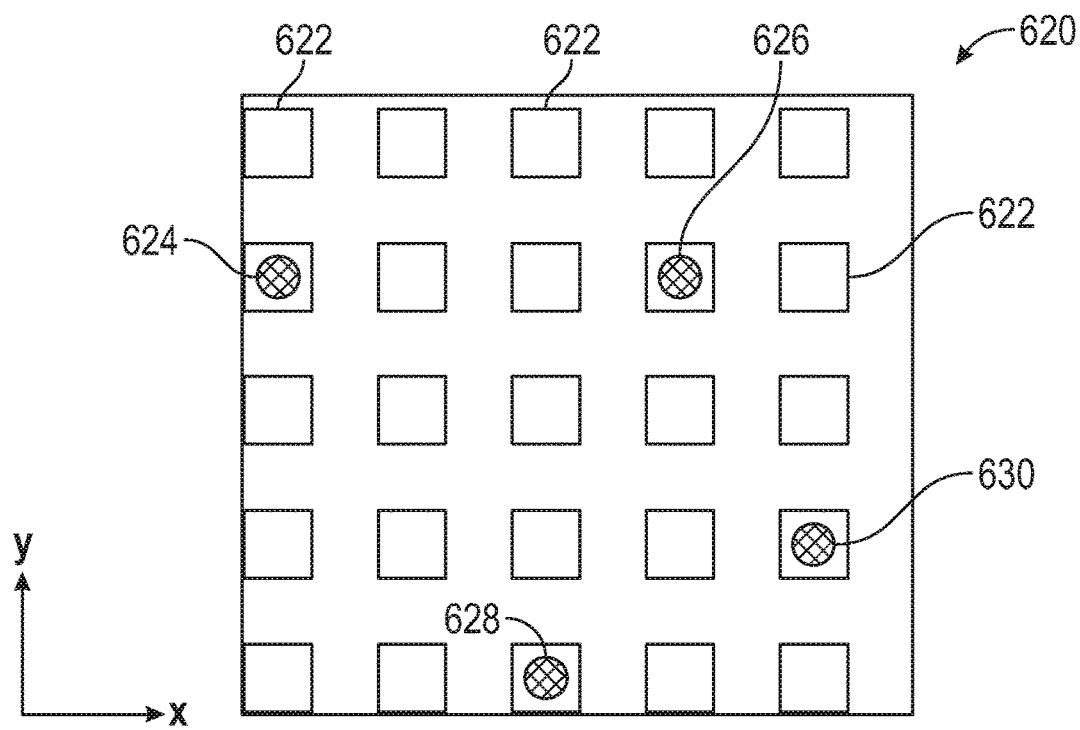
FIG. 6B is a schematic example of a third drop pattern generated in the exemplary nanofabrication method in accordance with an example embodiment.

The method may then proceed to step S406, where a second drop pattern 600 of formable material and a third drop pattern 620 of formable material are generated, each based on the received information regarding the distortion within the imprint system 100. FIG. 6A shows a schematic example of a second drop pattern 600 and FIG. 6B shows a schematic example of a third drop pattern 620. Similar to the first drop pattern 500, the second drop pattern 600 and the third drop pattern 620 include a plurality of potential drop positions 602, 622 represented by squares and a plurality of drop positions 604, 606, 608, 610, 624, 626, 628, 630 that have been designated as positions for which a drop should be dispensed.

Regarding the second drop pattern 600, the drop positions 604, 606, 608, 610 for which a drop is designated to be dispensed is indicated by a circle with horizontal hatching in FIG. 6A. Each of the drop positions 604, 606, 608, 610 are located within one of the squares representing the potential drop positions 602. The squares that do not have circles within them indicate that a drop is not designated to be dispensed from the particular location. Thus, as with the first drop pattern 500, the presence or absence of drops within the possible drop positions 602 defines the second drop pattern 600. As with the first drop pattern 500, while FIG. 6A shows only a relatively small number of designated drop positions and possible drop positions, an actual drop pattern may have thousands, tens of thousands, hundreds of thousands, or millions of designated drop positions/possible drop positions depending on the application. Furthermore, while the drops 604, 606, 608, 610 are schematically shown as circles in FIG. 6A, it should be understood that in practice the drops are not necessarily circular and may have an amorphous shape. The second drop pattern 600 essentially represents the desired location of the drops 604, 606, 608, 610 on the substrate 102 to account for distortion in the imprint system.

Regarding the third drop pattern 620, the drop positions 624, 626, 628, 630 for which a drop is designated to be dispensed is indicated by a circle with checkered hatching in FIG. 6B. Each of the drop positions 624, 626, 628, 630 are located within one of the squares representing the potential drop positions 622. The squares that do not have circles within them indicate that a drop is not designated to be dispensed from the particular location. Thus, as with the first drop pattern 500, the presence or absence of drops within the possible drop positions 622 defines the third drop pattern 620. As with the first drop pattern 500, while FIG. 6B shows only a relatively small number of designated drop positions and possible drop positions, an actual drop pattern may have thousands, tens of thousands, hundreds of thousands, or millions of designated drop positions/possible drop positions depending on the application. Furthermore, while the drops 624, 626, 628, 630 are schematically shown as circles in FIG. 6B, it should be understood that in practice the drops are not necessarily circular and may have an amorphous shape. The third drop pattern 620 essentially represents the desired location of the drops 624, 626, 628, 630 on the substrate 102 to account for distortion in the imprint system.

The second drop pattern 600 and the third drop pattern 620 are prepared in a similar manner as the step of "determining a dispense pattern for the formable material" as described in the '962 patent, which is incorporated by reference herein. That is, the step of "determining a dispense pattern for the formable material" described in the '962 patent is the similar to step S406 of the nanofabrication method 400 shown in FIG. 4 in that the second drop pattern 600 and the third drop pattern 620 are generated based on the received information regarding the distortion within the imprint system 100. However, as discussed above, because the first drop pattern 500 already takes into account the pattern of the template and substrate, the second drop pattern 600 and the third drop pattern 620 need not take into account the pattern of the template or the substrate. That is, in an example embodiment, the second drop pattern 600 and the third drop pattern 620 are based on the information regarding the distortion in the imprint system and not the topography of the template or the substrate.

To generate the second drop pattern 600 and the third drop pattern 620, once the information regarding distortion in the imprint system 100 is received, the processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material, material properties of the patterning surface, material properties of the substrate surface, spatial variation in volume between the patterning surface and the substrate surface; fluid flow, evaporation; etc.

More particularly, the second drop pattern 600 and the third drop pattern 620 may be generated based on a distortion height map. A distortion height map provides an amount of vertical distortion the template 108 needs to undergo to deform such that it induces an in-plane distortion in the template 108 that counteracts measured, simulated, and/or estimated in-plane distortions coming from the imprinting process 300. Thus, a distortion height map is an example of "information regarding the distortion within the imprint system" described in the '962 patent and discussed above.

In one example embodiment, step S406 may include receiving a first distortion height map. The first distortion height map is measured, simulated, and/or estimated. Next, the mean distortion may be calculated from the received first distortion height map. That is, the mean is the average value of all the height values reported in the first distortion height map. Next, a second distortion height map is generated by subtracting the calculated mean distortion from the first height distortion map such that the mean of the second distortion height map is zero and contains both positive and negative heights. In other words, by subtracting the mean height value from all of the height values of the first distortion map, each of the values above the mean in the first distortion height map will result in a positive height value in the generated second distortion height map and each of the values below the mean in the first distortion height map will result in a negative height value in the generated second distortion height map. Next, the second distortion height map is used to form two sub-maps. The first sub-map is a positive map and the second sub-map is a negative map. In the positive map all positive heights of the second distortion height map are retained, while all negative heights set to zero. In other words, the positive height map represents only those heights of the second distortion height map that were above the mean. In the negative map all negative heights of the second distortion height map are retained and multiplied by negative one (—1), while all positive heights are set to zero. In other words, the negative height map represents the absolute values of only those heights of the second distortion height map that were below the mean.

After the positive and negative maps are formed, the second drop pattern 600 is generated based on the positive map in the same manner described in the '962 patent, while the third drop pattern 620 is generated based on the negative map in the same manner described in '962 patent. In other words, the positive map includes a subset of height information that can be used to generate the second drop pattern 600, while the negative map includes a subset of height information that can be used to generate the third drop pattern 620, where the generation of the drop patterns based on the information is performed in the same manner known in the art.

Figure 7A:
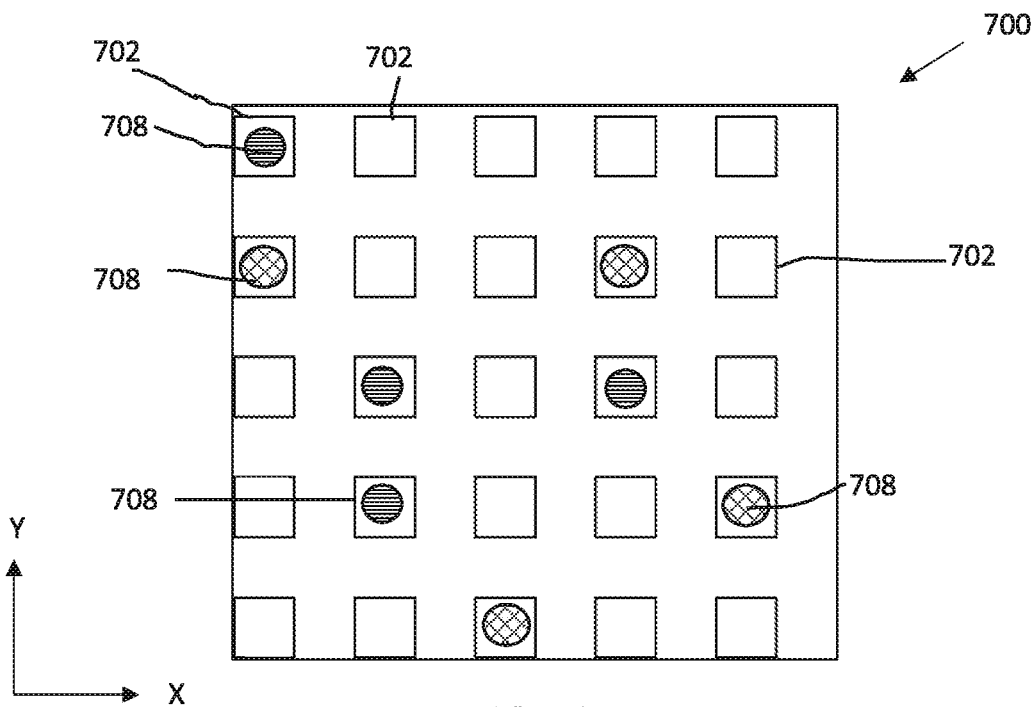
FIG. 7A is a schematic example of a preliminary drop pattern generated in the exemplary nanofabrication method in accordance with an example embodiment.

In another example embodiment, the second drop pattern 600 and the third drop pattern 620 may be generated differently. Rather than splitting the first distortion height map into two sub-maps above and below the mean height, a preliminary drop pattern 700 can be first generated based on the first distortion height map. FIG. 7A shows an example of a case where a preliminary drop pattern 700 is generated. The drop positions 708 for which a drop is designated to be dispensed is indicated by a circle in FIG. 7A. Each of the drop positions 708 are located within one of the squares representing the potential drop positions 702. The squares that do not have circles within them indicate that a drop is not designated to be dispensed from the particular location.

In this embodiment, the preliminary drop pattern 700 would be generated in the same manner described in the '962 patent and would therefore include drops accounting for all of the heights, both below and above the mean height in a single drop pattern. Because the preliminary drop pattern 700 includes drop positions accounting for heights both above and below the mean height, in this example embodiment, the preliminary drop pattern 700 is then split into two drop patterns, the two drop patterns being the second drop pattern 600 and the third drop pattern 620. As above, the mean distortion may be calculated from the received first distortion height map. Based on this mean height, all of the drop positions 708 of the preliminary drop pattern 700 that correspond to the heights above the mean are separated to form the second drop pattern 600 and all of the drop positions 708 that correspond to heights below the mean are separated to form the third drop pattern 620. Thus, it is possible to arrive at the same second drop pattern 600 and third drop pattern 620 by splitting the preliminary drop pattern 700. In FIG. 7A, the various drop positions 708 have the same hatching used in FIGS. 6A and 6B to show that the preliminary drop pattern 700 contains the drop positions of the second drop pattern 600 and the third drop pattern 620.

Figure 7B:
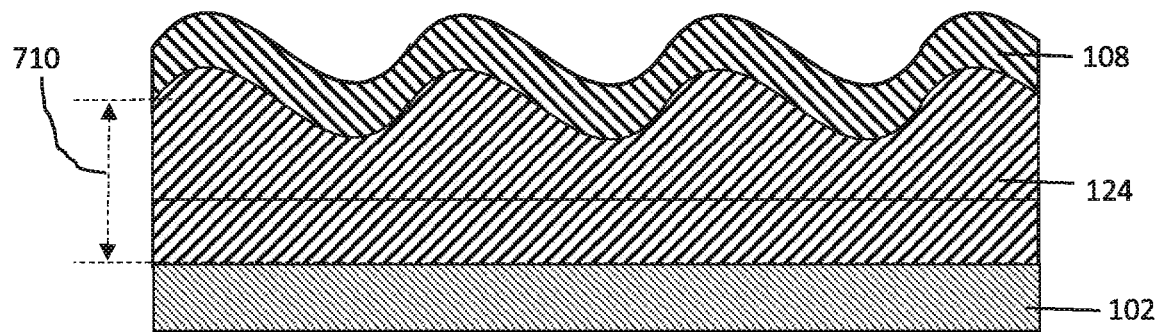
FIG. 7B is a schematic sectional view of a case where formable material is dispensed onto the substrate according to the preliminary drop pattern of FIG. 7A in accordance with an example embodiment.
Figure 10A:
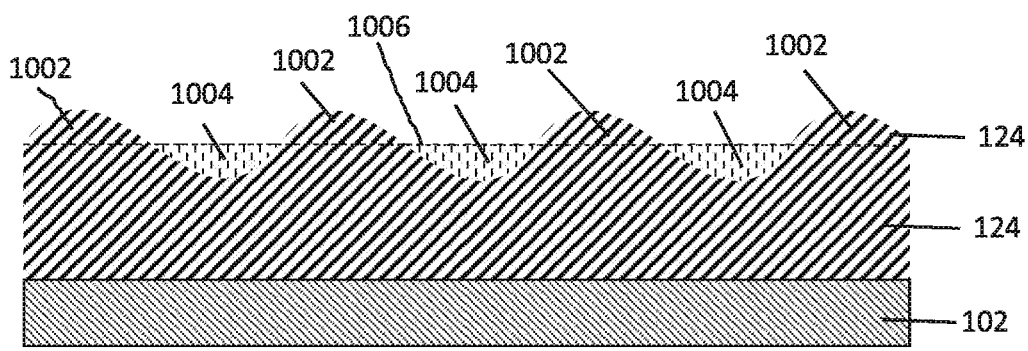
FIG. 10A is a schematic sectional view of a case where formable material is dispensed onto the substrate according to the fourth drop pattern in accordance with an example embodiment.

FIG. 7B shows a schematic sectional view of a case where formable material 124 is dispensed onto the substrate 102 according to the preliminary drop pattern 700 and contacted with the template 108. While formable material 124 is not in fact dispensed according to the preliminary drop pattern 700 in the method described herein, a comparison of FIG. 7B with FIGS. 5B and 10A shows a benefit of the method 400. FIG. 7B shows the moment in time after the template 108 has contacted the formable material 124 dispensed according to the preliminary drop pattern 700. The preliminary drop pattern 700, having been particularly selected based on counteracting distortion in the imprint system, will induce bending on the template 108 in a desired manner. For example, FIG. 7B shows a moment when the template 108 has been bent due to the different areal densities of formable material. As shown in FIG. 7B, the relative thicknesses of different sections of the formable material 124 induces a bending in the template 108 that mirrors the distortion in the substrate and/or chuck. This is the same principle as described in the '962 patent. However, the mean RLT 710 of the second preliminary pattern 700 shown in FIG. 7B is greater than the mean RLT 510 of the first drop pattern 500 shown in FIG. 5B.

While the generating of the first drop pattern (step S404) has been described above and is shown in FIG. 4 as occurring before the generating of the second drop pattern and the third drop pattern (step S406), these steps can occur in either order.

As shown in FIG. 4, after generating the first drop pattern 500, the second drop pattern 600, and the third drop pattern 620, the method may proceed down two different flow paths representing two different example embodiments. In one example embodiment, the method may proceed to step S408, where a first plurality of drop positions is added to the first drop pattern 500 to form an intermediate drop pattern 800. In step S408, the first plurality of drop positions being added to the first drop pattern 500 correspond to drop positions defined by the second drop pattern 600. In other words, the drop positions defined by the second drop pattern 600 is added to the first drop pattern 500 to form the intermediate drop pattern 800. Then, after adding the first plurality of drop positions of the second drop pattern 600 to the first drop pattern in step S408, the method may proceed to step S410 where a second plurality of drop positions are removed from the intermediate drop pattern 800, thereby forming a fourth drop pattern 900. The second plurality of drop positions removed from the intermediate drop pattern 800 correspond to the drop positions defined by the third drop pattern 620. In other words, the drop positions defined by the third drop pattern 620 is removed from the intermediate drop pattern 800 to form the fourth drop pattern 900.

Figure 8A:
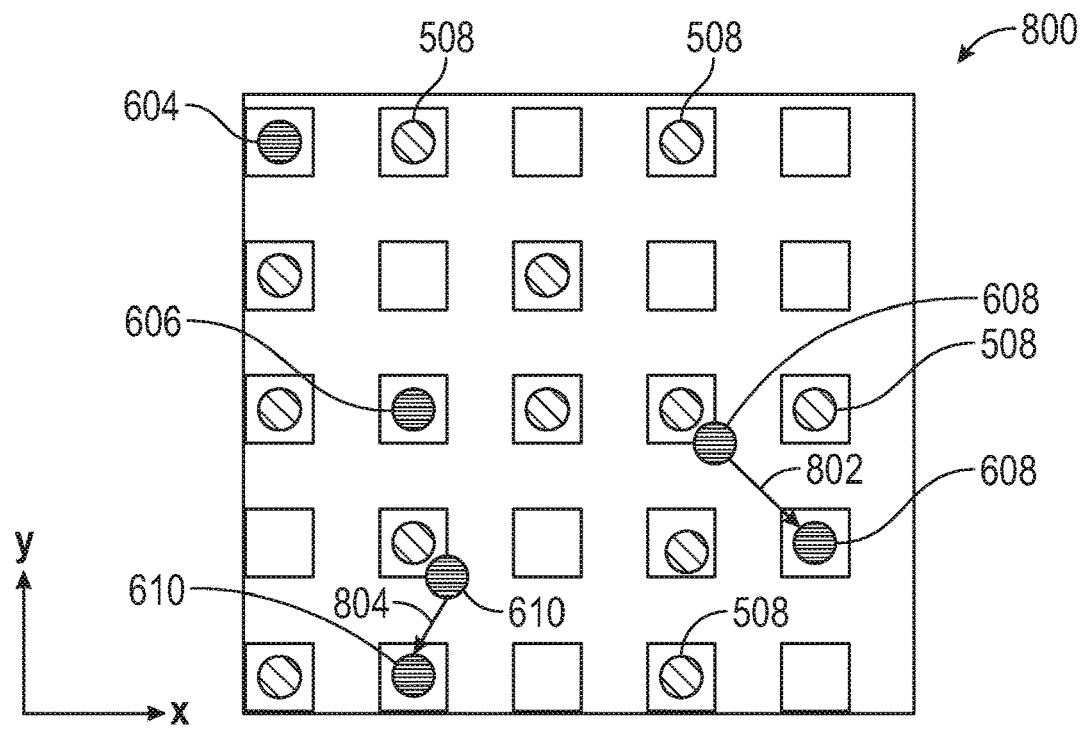
FIG. 8A is a schematic example of an intermediate drop pattern showing the process of adding drop positions defined by the second drop pattern to the first drop pattern to form the intermediate drop pattern in accordance with an example embodiment.
Figure 8B:
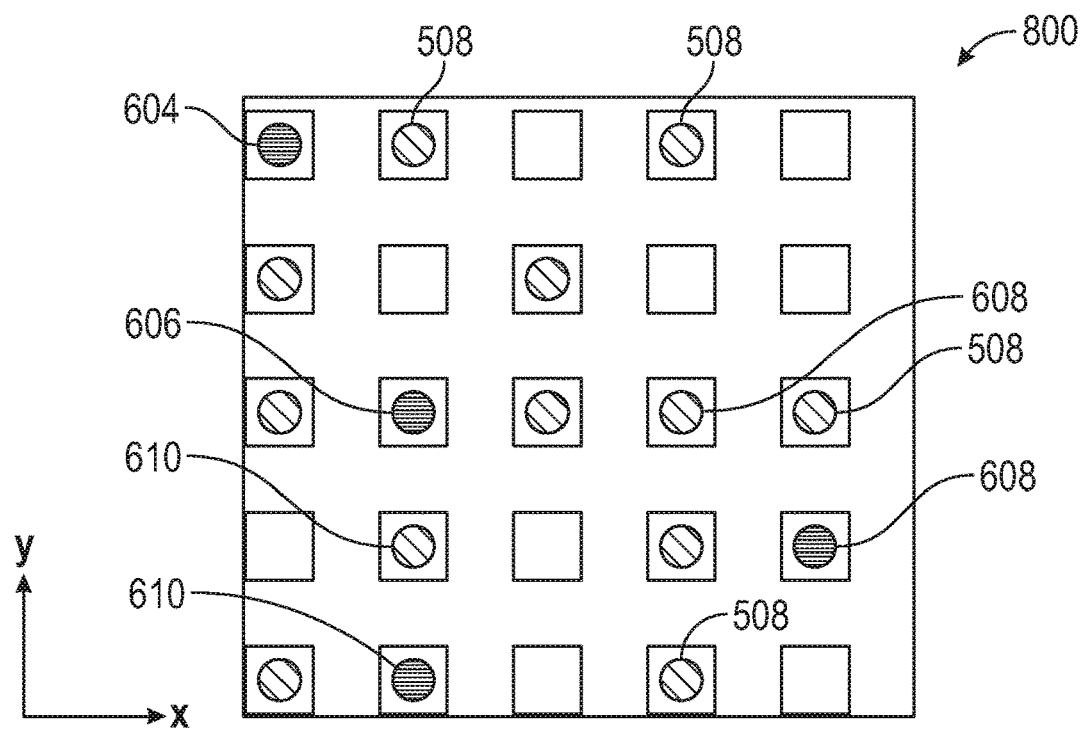
FIG. 8B is a schematic example of the intermediate drop pattern of FIG. 8A after the drop positions defined by the second drop pattern have been added to first drop pattern to form the intermediate drop pattern in accordance with an example embodiment.

FIG. 8A shows a schematic example of an intermediate drop pattern 800 including showing the process of adding the drop positions 604, 606, 608, 610 of the second drop pattern 600 to the first drop pattern 500 to form the intermediate drop pattern 800. FIG. 8B shows a schematic example of the intermediate drop pattern 800 of FIG. 8A after the drop positions 604, 606, 608, 610 of the second drop pattern 600 have been added to first drop pattern 500 to form the intermediate drop pattern 800. As seen in FIGS. 8A and 8B, the intermediate drop pattern 800 includes all of the drop positions from the first drop pattern 500. That is, each of the drop positions 508 of the first drop pattern are maintained when forming the intermediate drop pattern 800. In other words, as mentioned above, the drop positions 604, 606, 608, 610 are added to the first drop pattern 500. The drop positions of FIGS. 8A and 8B have the same cross hatching in FIGS. 5A, 6A, and 7A to assist in demonstrating which drop positions in FIGS. 8A and 8B originate from the first drop pattern 500 and which drops are from the second drop pattern 600. When adding the drop positions 604, 606, 608, 610 to the first drop pattern 500, each drop position 604, 606, 608, 610 is added to a free location of the first drop pattern 500.

In the instant example, drop position 604 and drop position 606 each coincide with a drop position that is already free in the first drop pattern 500. That is, if one were to overlay the second drop pattern 600 onto the first drop pattern 500, then the drop position 604 and the drop position 606 overlap with potential drop positions in the first drop pattern 500 that do not already have a drop position assigned. Accordingly, in the intermediate drop pattern 800, the drop positions 604, 606 are simply designated to those free drop positions. However, with respect to drop position 608 and drop position 610, the corresponding drop positions in the first drop pattern 500 are already designated as being a location for dispensing a drop. That is, if one were to overlay the second drop pattern 600 onto the first drop pattern 500, then the drop position 608 and the drop position 610 overlap with a location in the first drop pattern 500 that already have a drop position assigned. Thus, as only one drop can be dispensed to a single location, the drop position 608 and the drop position 610 are instead assigned to the nearest open drop position. This is shown FIG. 8A via arrows 802, 804. As shown in FIG. 8A, arrow 802 indicates that the drop position 608 has been moved from the original position to the closest open drop position, while arrow 804 indicates that the drop position 610 has been moved from the original position to the to the closest open drop position. It should be noted that in this example there are other open drop positions that are equidistant from the original position. Thus, the final locations of the drop positions 608, 610, may be arbitrarily chosen in FIG. 8A among the equidistant drop locations and any of the other equidistant drop locations would also have been suitable. FIG. 8B shows the intermediate drop pattern 800 after the drop positions 608, 610 have been assigned to the final locations.

Figure 9A:
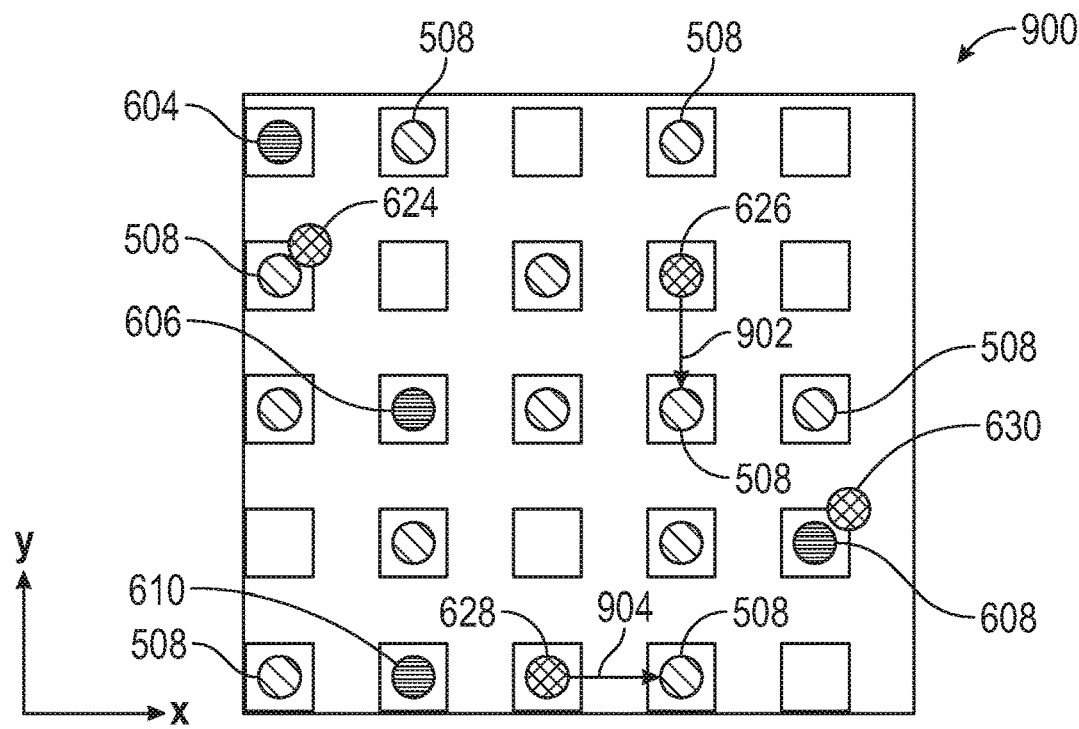
FIG. 9A is a schematic example of a fourth drop pattern including showing the process of removing drop positions defined by the third drop pattern from the intermediate drop pattern to form the fourth drop pattern in accordance with an example embodiment.
Figure 9B:
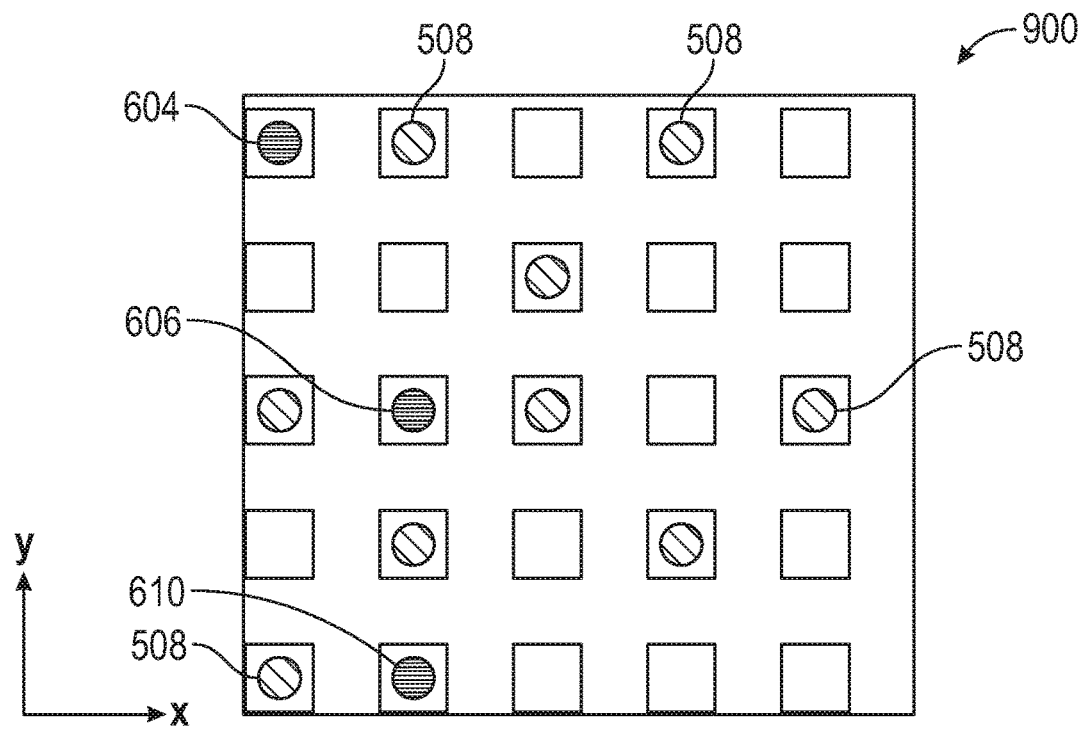
FIG. 9B is a schematic example of the fourth drop pattern of FIG. 9A after the drop positions of the third drop pattern have been removed from the intermediate drop pattern to form the fourth drop pattern in accordance with an example embodiment.

After generating the intermediate drop pattern 800, the method may proceed to step S410, where the second plurality of drop positions (FIG. 6B) are removed from the intermediate drop pattern 800, thereby forming a fourth drop pattern 900 (FIG. 9B). As noted above, the second plurality of drop positions correspond to the drop positions 624, 626, 628, 630 defined by the third drop pattern 620.

FIG. 9A shows a schematic example of a fourth drop pattern 900 including the process of removing the drop positions 624, 626, 628, 630 of the third drop pattern 620 from the intermediate drop pattern 800 to form the fourth drop pattern 900. FIG. 9B shows a schematic example of the fourth drop pattern 900 of FIG. 9A after the drop positions 624, 626, 628, 630 of the third drop pattern 620 have been removed from the intermediate drop pattern 800 to form the fourth drop pattern 900. As seen in FIGS. 9A and 9B, the fourth drop pattern 900 includes less drop designated positions than the intermediate drop pattern 800. That is, some of the drop positions of the intermediate drop pattern 800 are maintained, but some of the drop positions are removed when forming the fourth drop pattern 900. In other words, as mentioned above, the drop positions 624, 626, 628, 630 are removed from the intermediate drop pattern 800. The drop positions of FIGS. 9A and 9B have the same cross hatching in FIGS. 5A, 6A, 7A, and 7B to assist in demonstrating which drop positions in FIG. 9B originate from the first drop pattern 500, which drop positions are added from the second drop pattern 600, and which drop positions have been removed based on the third drop pattern 620.

When removing the drop positions 624, 626, 628, 630 from the intermediate drop pattern 800, each drop position 624, 626, 628, 630 is assigned to one of the drop positions of the intermediate drop pattern 800 so that a number of drop positions equal to the number of drop positions in the second plurality of drop positions is removed from the intermediate drop pattern 800. In the instant example, because the number of drop positions of the second plurality of drop positions is four, then four drop positions are removed from the intermediate drop pattern 800. While four drop positions are used in the example for simplicity, in practice the number of drop positions being removed could be on the order of thousands, tens of thousands, hundreds of thousands, or millions depending on the application. As explained below, the drop positions being removed from the intermediate drop pattern 800 can be either or both of the drop positions 508 originating from the first drop pattern 500 or the drop positions 604, 606, 608, 610 originating from the second drop pattern 600. The drop positions being removed from the intermediate drop pattern 800 are those drop positions that correspond to the drop positions of the second plurality of drops, e.g., drop positions 624, 626, 628, 630 of the third drop pattern 620.

As shown in FIG. 9A, in the instant example embodiment, drop position 624 and drop position 630 of the second plurality of drops each coincide with two drops of the intermediate drop pattern 800. In particular, drop position 624 coincides with one of the drop positions 508 originating form the first drop pattern 500 and drop position 630 coincides with drop position 608 of the second plurality of drops 700. That is, if one were to overlay the second plurality of drops onto the intermediate drop pattern 800, then the drop position 624 and the drop position 630 overlap with one of the assigned drop positions 508 originating from the first drop pattern 500 and one of the assigned drop positions 608 originating from the first plurality of drops of the second drop pattern 600. Accordingly, in the fourth drop pattern 900, the corresponding drop position 508 and the corresponding drop position 608 are no longer designated as a drop position. That is, these previously designated drop positions are removed from the intermediate drop pattern 800 such that in the fourth drop pattern 900 there is no drop indicated in those positions.

However, with respect to drop position 626 and drop position 628 of the second plurality of drops of the third drop pattern 620, the corresponding drop positions in the intermediate drop pattern 800 are already open drop positions. That is, if one were to overlay the second plurality of drop positions of the third drop pattern 620 onto the intermediate drop pattern 800, then the drop position 626 and the drop position 628 overlap with a location in the intermediate drop pattern 800 that does not have a drop position to remove. Thus, the drop position 626 and the drop position 630 to be removed are instead assigned to the nearest designated drop position. This is shown in FIG. 9A via arrows 902, 904. As shown in FIG. 9A, arrow 902 indicates that the drop position 626 has been moved from the original position to the closest designated drop position, while arrow 904 indicates that the drop position 630 has been moved from the original position to the closest designated drop position, both of which are drop positions 508 that originated from the first drop pattern 500. It should be noted that in this example there are other designated drop positions that are equidistant from the original position. Thus, the final locations of the drop positions 626, 630 to be removed have been arbitrarily chosen in FIG. 9A among the equidistant designated drop locations and any of the other equidistant designated drop locations would also have been suitable, as long as each drop position of the second plurality of drops is assigned to some designated drop position of the intermediate drop pattern 800. FIG. 9B shows the fourth drop pattern 900 after the drop positions corresponding to the drop positions for the second plurality of drops have been removed.

In the example embodiment following the first path of steps S408, S410, the drop positions are removed from the intermediate drop pattern 800 rather than from the first drop pattern 500 (i.e., drop positions are removed after the drop position of the second drop pattern 600 have been added) because the drop positions to be removed may be either drop positions originating from the first drop pattern 500 or drop positions originating from second drop pattern 600. If the removal step was performed prior to the addition step (i.e., prior to forming the intermediate drop pattern 800), then only drop positions originating from the first drop pattern 500 would be removed, which is what occurs in an example embodiment discussed below.

After removing the second plurality of drop positions form the intermediate drop pattern 800 to form the fourth drop pattern 900, the method may proceed to step S412, where the imprinting method 300 described above is performed using the fourth drop pattern 900. That is, the imprinting method is the same as describe above, where in step S302, the drops are dispensed according to the fourth drop pattern 900.

As noted above, after generating the first drop pattern 500, the second drop pattern 600, and the third drop pattern 620, the method may proceed down two different flow paths representing two different example embodiments. In another example embodiment, the method may proceed to step S414 instead of step S408 described above. In step S414 the second plurality of drop positions is removed from the first drop pattern 500 to form an intermediate drop pattern. In step S414, the second plurality of drop positions being removed from the first drop pattern 500 correspond to drop positions defined by the third drop pattern 620. In other words, the drop positions defined by the third drop pattern 620 are removed from the first drop pattern 500 to form the intermediate drop pattern. Then, after removing the second plurality of drop positions of the third drop pattern 620 from the first drop pattern in step S414, the method may proceed to step S416 where the first plurality of drop positions are added to the intermediate drop pattern, thereby forming a fourth drop pattern. The first plurality of drop positions added to the intermediate drop pattern correspond to the drop positions defined by the second drop pattern 600. In other words, the drop positions defined by the first drop pattern 600 is added to the intermediate drop pattern to form the fourth drop pattern. In short, the flow path of steps S414 and S416 is the opposite order of the other flow path of steps S408 and S410. That is, instead of adding the drop positions of the second drop pattern 600 and then removing the drop positions of the third drop pattern 620, the drop positions of the third drop pattern 620 are first removed from the first drop pattern 500 and then the drop positions of the first drop pattern 600 are added. The process of removing and adding drop positions is the same as discussed above, including that if there is no corresponding designated drop position to remove in the first drop pattern, the nearest designated drop position should be removed and if there is already a corresponding drop position in the intermediate drop pattern, the nearest non-designated position should be designated as a drop position. Because of the order of the steps is reversed, the intermediate drop pattern and the fourth drop pattern will be different than what is shown in the figures, which illustrate the flow path of steps S408 and S410. However, the principle of removing and adding drop positions is the same as described above. As shown in FIG. 4, regardless of how the fourth drop pattern is generated, the method proceeds to step S412, where the fourth drop pattern is dispensed as part of the fabrication method.

FIG. 10A shows a schematic sectional view of a case where formable material 124 is dispensed onto the substrate 102 according to the fourth drop pattern 900. As shown in FIG. 10A, there are first plurality of regions 1002 defining peaks and a second plurality of regions 1004 defining valleys relative to a horizontal line 1006. The horizontal line 1006 is located at the same height from the substrate 102 as the top of the RLT layer shown in FIG. 5B. Each region of the first plurality of regions 1002 corresponds to drops that were dispensed as a result of the addition of drop positions having been added relative to the first drop pattern 500. In other words, each region of the first plurality of regions 1002 corresponds to the added drop positions of the second drop pattern 600 that remain in the fourth drop pattern 900 after the subtraction of other drop positions. Similarly, each of region of the second plurality of regions 1004 corresponds to drops that were not dispensed as a result of drop positions having been removed from the intermediate drop pattern 800. In other words, each region of the second plurality of regions 1004 is empty space that would have been present if not for the drop positions having been removed from the intermediate drop pattern 800. Thus, each region of the first plurality of regions 1002 above the horizontal line 1006 are portions of formable material that are present because drop positions were added to the drop pattern, while each region of the second plurality of regions 1004 below the horizontal line 1020 is empty space that is present because drop positions were removed from the drop pattern.

Because the first plurality of regions 1002 are regions above the target mean RLT and the second plurality of regions 1004 are regions below the target mean RLT, the overall mean RLT produced by dispensing the fourth drop pattern 900 is still the same as the target mean RLT. That is, the first plurality of regions 1002 above the horizontal line 1006 and the second plurality of regions 1004 below the horizontal line 1006 balance each other out such that the mean RLT has not changed between FIG. 5B and FIG. 10A. In other words, the mean RLT resulting from dispensing drops according to the first drop pattern 500 is the same or substantially same as the mean RLT resulting from dispensing drops according to the fourth drop pattern 900. Preferably the mean RLT resulting from dispensing the fourth drop pattern 900 is within 5% of the mean RLT resulting from dispensing the first drop pattern 500, more preferably within 3%, within 1%, or within 0.5%.

Figure 10B:
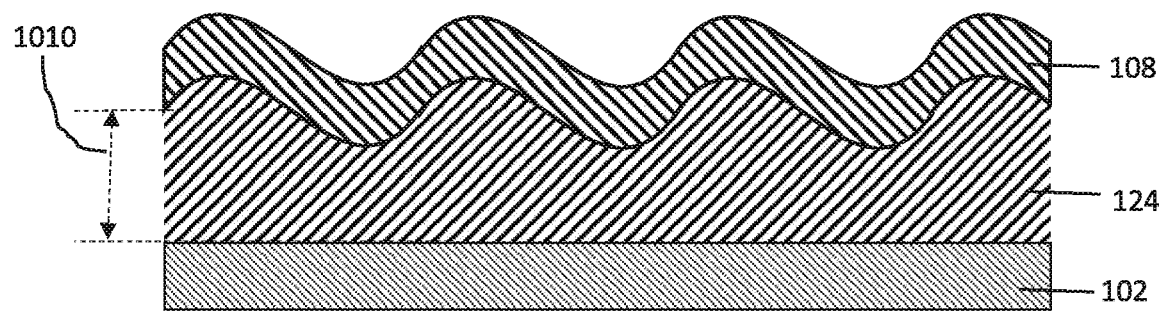
FIG. 10B is a schematic sectional view of a case where formable material is dispensed onto the substrate according to the fourth drop pattern and contacted with the template in accordance with an example embodiment.

FIG. 10B shows a schematic sectional view of a case where formable material 124 is dispensed onto the substrate 102 according to the fourth drop pattern 900 and contacted with the template 108. FIG. 10B shows the moment in time after the template 108 has contacted the formable material 124 dispensed according to the fourth drop pattern 900. The fourth drop pattern 900, having had drop positions added and removed based on the second drop pattern 600 and the third drop pattern 620 as part of the process of generating the fourth drop pattern 900, where the drop positions were selected based on counteracting distortion in the imprint system, will induce bending on the template 108 in the same desired manner as in FIG. 6B. For example, FIG. 10B shows a moment when the template 108 has been bent due to the different areal densities of formable material. As shown in FIG. 10B, the relative thicknesses of different sections of the formable material 124 induces a bending in the template 108 that mirrors the distortion in the substrate and/or chuck. This is the same principle as described in the '962 patent and has the same pattern as FIG. 6B. However, as discussed above, because the drop positions were added and removed relative to the first drop pattern 500 as part of the process of generating the fourth drop pattern 900, the mean RLT 1010 resulting from the fourth drop pattern 900 shown in FIG. 10B is substantially the same as the mean RLT 510 of the first drop pattern 500 shown in FIG. 5B. That is, dispensing drops according to the fourth drop pattern 900 achieves the target mean RLT of the first drop pattern 500 and while also counteracting distortion in the imprint system of the second drop pattern 600 and the third drop pattern 620.

As discussed above, the nanofabrication method disclosed herein provides the benefit of compensating for deviations in the imprint system to improve overlay without substantially increasing the target mean RLT. As a result of using the fabrication method described herein, the overlay error between the second cured layer and an underlying layer of the substrate is less than 10 nm, while avoiding negative impact on throughput, extrusion, and etching processes.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A nanofabrication method comprising:
receiving measurements of a distortion within an imprint system;
generating a first drop pattern of formable material that is not based on the received measurements of the distortion within the imprint system;
generating a second drop pattern of formable material and a third drop pattern of formable material, each based on the received measurements of the distortion within the imprint system;
modifying the first drop pattern to generate a fourth drop pattern of formable material, wherein the modifying of the first drop pattern to generate the fourth drop pattern includes:
adding a first plurality of drop positions to the first drop pattern or removing a second plurality of drop positions from the first drop pattern, thereby forming an intermediate drop pattern, wherein the first plurality of drop positions corresponds to drop positions defined by the second drop pattern and the second plurality of drop positions corresponds to drop positions defined by the third drop pattern;
in a case where the first plurality of drops positions are added to the first drop pattern to form the intermediate drop pattern, removing the second plurality of drop positions from the intermediate drop pattern, thereby forming the fourth drop pattern; and
in a case where the second plurality of drops positions are removed from the first drop pattern to form the intermediate drop pattern, adding the first plurality of drop positions to the intermediate drop pattern, thereby forming the fourth drop pattern;
dispensing drops of formable material onto a substrate according to the fourth drop pattern; and
contacting the dispensed drops with a template or superstrate to form a film.

2. The nanofabrication method of claim 1, wherein the modifying of the first drop pattern to generate the fourth drop pattern includes:
adding the first plurality of drop positions to the first drop pattern, thereby forming the intermediate drop pattern; and
removing the second plurality of drop positions from the intermediate drop pattern, thereby forming the fourth drop pattern.

3. The nanofabrication method of claim 2, wherein removing the second plurality of drop positions from the intermediate drop pattern comprises removing one or more of the drop positions that were added to the first drop pattern.

4. The nanofabrication method of claim 2, wherein removing the second plurality of drop positions from the intermediate drop pattern comprises removing one or more of the drop positions that were not added to the first drop pattern.

5. The nanofabrication method of claim 2, wherein removing the second plurality of drop positions from the intermediate drop pattern comprises removing one or more of the drop positions that were added to the first drop pattern and removing one or more of the drop positions that were not added to the first drop pattern.

6. The nanofabrication method of claim 2,
wherein the first drop pattern comprises designated drop positions and non-designated drop positions, and
wherein adding the first plurality of drop positions to the first drop pattern comprises designating each drop position of the first plurality of drop positions to a non-designated drop position.

7. The nanofabrication method of claim 2,
wherein the intermediate drop pattern comprises designated drop positions and non-designated drop positions, and
wherein removing the second plurality of drop positions from the intermediate drop pattern comprises removing a designated drop position for each drop position of the second plurality of drop positions.

8. The nanofabrication method of claim 1, wherein the modifying of the first drop pattern to generate the fourth drop pattern includes:
removing the second plurality of drop positions from the first drop pattern, thereby forming the intermediate drop pattern; and
adding the first plurality of drop positions to the intermediate drop pattern, thereby forming the fourth drop pattern.

9. The nanofabrication method of claim 1, wherein the first plurality of drop positions and the second plurality of drop positions are selected such that a mean residual layer thickness of the formable material dispensed according to the fourth drop pattern, when compared to formable material dispensed onto the substrate according to the first drop pattern, is within 5% of a mean residual layer thickness of the formable material dispensed onto the substrate according to the first drop pattern.

10. The nanofabrication method of claim 1, wherein the dispensing of the formable material according to the fourth drop pattern results in a plurality of regions of formable material having a first mean residual layer thickness, when compared to formable material dispensed according to the first drop pattern, that is greater than a second mean residual layer thickness of the formable material dispensed according to the first drop pattern.

11. The nanofabrication method of claim 1, wherein the dispensing of the formable material according to the fourth drop pattern results in a plurality of regions of formable material having a first mean residual layer thickness, when compared to formable material dispensed according to the first drop pattern, that is smaller than a second mean residual layer thickness of the formable material dispensed according to the first drop pattern.

12. The nanofabrication method of claim 1, wherein generating the second drop pattern and the third drop pattern comprises:
receiving a first distortion height map;

calculating a mean distortion height of the first distortion height map;
generating a second distortion height map by subtracting the calculated mean distortion height from the first distortion height map, the second distortion height map comprising positive heights and negative heights as a result of the subtracting;
generating a positive map by retaining the positive heights and setting the negative heights to zero;
generating a negative map by retaining absolute values of the negative heights and setting the positive heights to zero; and
generating the second drop pattern based on the positive map; and
generating the third drop pattern based on the negative map.

13. The nanofabrication method of claim 1, wherein the first drop pattern is based on a target mean residual layer thickness.

14. The nanofabrication method of claim 1, wherein the first drop pattern is based on at least one of a topography of the substrate and a topography of the template.

15. The nanofabrication method of claim 1, wherein the second drop pattern and the third drop pattern are not based on a topography of the substrate or a topography of the template.

16. The nanofabrication method of claim 1, wherein the measurements of distortion within the imprint system comprises a planar deviation of the substrate, a planar deviation of the template, a planar deviation of a surface of a chuck supporting the substrate, image placement deviation of underlying features in an underlying layer of the substrate, or any combination thereof.

17. The nanofabrication method of claim 1, wherein the imprint system comprises the substrate and the template.

18. The nanofabrication method of claim 1, wherein an overlay error between the second cured layer and an underlying layer of the substrate is less than 10 nm.

19. A nanofabrication system, comprising:
a first chuck configured to hold a template or a superstrate;
a second substrate chuck configured to hold a substrate;
a processor configured to:
 receive measurements of a distortion within an imprint system;
 generate a first drop pattern of formable material that is not based on the received measurements of the distortion within the imprint system;
 generate a second drop pattern of formable material and a third drop pattern of formable material, each based on the received measurements of the distortion within the imprint system;
 modify the first drop pattern to generate a fourth drop pattern of formable material, wherein the modifying of the first drop pattern to generate the fourth drop pattern includes:
  adding a first plurality of drop positions to the first drop pattern or removing a second plurality of drop positions from the first drop pattern, thereby forming an intermediate drop pattern, wherein the first plurality of drop positions corresponds to drop positions defined by the second drop pattern and the second plurality of drop positions corresponds to drop positions defined by the third drop pattern;
  in a case where the first plurality of drops positions are added to the first drop pattern to form the intermediate drop pattern, removing the second plurality of drop positions from the intermediate drop pattern, thereby forming the fourth drop pattern; and
  in a case where the second plurality of drops positions are removed from the first drop pattern to form the intermediate drop pattern, adding the first plurality of drop positions to the intermediate drop pattern, thereby forming the fourth drop pattern;
a fluid dispenser configured to dispense formable material on the substrate in accordance with the fourth drop pattern;
a positioning system configured to contact the formable material with the template or superstrate in the template or superstrate chuck; and
a curing system configured to cure the formable material under the template or superstrate so as to form cured formable material on the substrate.

20. A method of making an article, comprising:
receiving measurements of a distortion within an imprint system;
generating a first drop pattern of formable material that is not based on the received measurements of the distortion within the imprint system;
generating a second drop pattern of formable material and a third drop pattern of formable material, each based on the received measurements of the distortion within the imprint system;
modifying the first drop pattern to generate a fourth drop pattern of formable material, wherein the modifying of the first drop pattern to generate the fourth drop pattern includes:
 adding a first plurality of drop positions to the first drop pattern or removing a second plurality of drop positions from the first drop pattern, thereby forming an intermediate drop pattern, wherein the first plurality of drop positions corresponds to drop positions defined by the second drop pattern and the second plurality of drop positions corresponds to drop positions defined by the third drop pattern;
 in a case where the first plurality of drops positions are added to the first drop pattern to form the intermediate drop pattern, removing the second plurality of drop positions from the intermediate drop pattern, thereby forming the fourth drop pattern; and
 in a case where the second plurality of drops positions are removed from the first drop pattern to form the intermediate drop pattern, adding the first plurality of drop positions to the intermediate drop pattern, thereby forming the fourth drop pattern;
dispensing drops of formable material according to the fourth drop pattern onto the substrate; and
contacting a template or a superstrate with the dispensed drops, thereby forming a topography or a layer of the dispensed drops on the substrate; and
processing the formed topography or layer to make the article.

* * * * *